United States Patent
Kang

(10) Patent No.: US 7,645,617 B2
(45) Date of Patent: Jan. 12, 2010

(54) NONVOLATILE FERROELECTRIC MEMORY DEVICE USING SILICON SUBSTRATE, METHOD FOR MANUFACTURING THE SAME, AND REFRESH METHOD THEREOF

(75) Inventor: Hee Bok Kang, Cheongju-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 332 days.

(21) Appl. No.: 11/717,735

(22) Filed: Mar. 14, 2007

(65) Prior Publication Data

US 2008/0025063 A1    Jan. 31, 2008

(30) Foreign Application Priority Data

Jul. 27, 2006   (KR) ............... 10-2006-0070964
Dec. 22, 2006   (KR) ............... 10-2006-0132602

(51) Int. Cl.
    *H01L 21/8239*   (2006.01)
(52) U.S. Cl. ............ 438/3; 257/295; 257/E21.436; 257/E29.164; 257/E29.272
(58) Field of Classification Search ........ 257/295, 257/E21.208, E21.436, E21.663, E27.104, 257/E29.164, E29.272; 438/3
    See application file for complete search history.

(56) References Cited

U.S. PATENT DOCUMENTS

| | | | | |
|---|---|---|---|---|
| 5,751,037 A | * | 5/1998 | Aozasa et al. ............... 257/315 |
| 6,054,734 A | * | 4/2000 | Aozasa et al. ............... 257/315 |
| 6,448,115 B1 | | 9/2002 | Bae |
| 6,775,172 B2 | | 8/2004 | Kang et al. |
| 6,912,150 B2 | | 6/2005 | Portman et al. |
| 6,991,942 B1 | * | 1/2006 | Hsu et al. ...................... 438/3 |
| 7,112,837 B2 | * | 9/2006 | Hsu et al. ................... 257/295 |
| 7,379,320 B2 | * | 5/2008 | Hsu et al. ................... 365/145 |
| 2006/0138504 A1 | * | 6/2006 | Kang et al. ................. 257/295 |
| 2006/0138520 A1 | * | 6/2006 | Kang et al. ................. 257/314 |
| 2006/0238310 A1 | * | 10/2006 | Kang et al. ............. 340/10.51 |
| 2006/0268615 A1 | * | 11/2006 | Kang et al. ............ 365/185.18 |
| 2007/0086230 A1 | * | 4/2007 | Kang et al. ................. 365/145 |
| 2007/0086231 A1 | * | 4/2007 | Kang et al. ................. 365/145 |
| 2007/0090413 A1 | * | 4/2007 | Kang et al. ................. 257/250 |
| 2007/0153602 A1 | * | 7/2007 | Kang ......................... 365/207 |
| 2007/0153620 A1 | * | 7/2007 | Kang ..................... 365/230.06 |
| 2007/0170480 A1 | * | 7/2007 | Kang et al. ................. 257/295 |
| 2007/0170481 A1 | * | 7/2007 | Kang et al. ................. 257/295 |
| 2007/0176218 A1 | * | 8/2007 | Kang ......................... 257/295 |
| 2008/0023741 A1 | * | 1/2008 | Kang ......................... 257/295 |
| 2008/0025105 A1 | * | 1/2008 | Kang ..................... 365/185.25 |

FOREIGN PATENT DOCUMENTS

| | | |
|---|---|---|
| JP | 06-021477 | 1/1994 |
| JP | 2006-155837 | 6/2006 |
| KR | 10-1998-078509 | 7/2006 |

* cited by examiner

*Primary Examiner*—Anh Phung
*Assistant Examiner*—Michael Lulis
(74) *Attorney, Agent, or Firm*—IP & T Law Firm PLC

(57) ABSTRACT

A nonvolatile ferroelectric memory device using a silicon substrate includes an insulating layer formed in an etching region of the silicon substrate, a floating channel layer formed over the bottom word line, an impurity layer formed at both ends of the floating channel layer and including a source region formed over the insulating layer and a drain region formed over the silicon substrate, a ferroelectric layer formed over the floating channel layer, and a word line formed over the ferroelectric layer.

15 Claims, 18 Drawing Sheets

NONVOLATILE FERROELECTRIC MEMORY DEVICE USING SILICON SUBSTRATE, METHOD FOR MANUFACTURING THE SAME, AND REFRESH METHOD THEREOF

CROSS-REFERENCES TO RELATED APPLICATIONS

The present application claims the benefit of priority of Korean Patent Application Nos. 10-2006-00070964, filed on Jul. 27, 2006, and 10-2006-0132602, filed on Dec. 22, 2006, which is incorporated by reference in its entirety. Moreover, the present application is related to U.S. Pat. Nos. 6,775,172, and 6,912,150, the contents of which are also incorporated herein by reference in their entirety.

BACKGROUND

The present invention generally relates to a nonvolatile ferroelectric memory device using a silicon substrate, a method for manufacturing the same, and a refresh method thereof, and more specifically, to a technology of providing a one transistor (1T) capacitorless type nonvolatile ferroelectric memory device using a bulk-silicon substrate.

In general, a DRAM requires a continuous power supply to store data as a volatile memory. When a power is not supplied, data of a RAM may be destroyed because a memory cell of the DRAM is designed to have small capacitors for keeping the charged power and for retaining the data. If these capacitors are not recharged, the capacitor loses the previously charged power, thus losing the data.

A refresh operation refers to a recharging process of a memory cell in a memory chip. Memory cells in a row can be charged in each refresh cycle. Although the refresh operation is performed by memory control of the system, some chips are designed to perform a self-refresh operation.

For example, there is disclosed a DRAM chip, which has a self-refresh circuit configured to perform a self-refresh operation without a Central Processing Unit (CPU) or an external refresh circuit. The self-refresh method has been frequently used in portable computers to reduce power consumption.

In the conventional volatile DRAM having a short refresh cycle, the refresh operation is frequently performed, which results in large power consumption and degradation of operation performance.

As an example of these integrated circuits, a nonvolatile ferroelectric memory, such as a Ferroelectric Random Access Memory (FeRAM) device, which has attracted considerable attention as a next generation memory device because it has a data processing speed as fast as a Dynamic Random Access Memory (DRAM) and conserves data even after the power is turned off.

An FeRAM having a structure similar to that of a DRAM includes capacitors made of a ferroelectric substance, which has a high residual polarization allowing for retention of data after power is turned off.

A One-Transistor One-Capacitor (1T1C) type unit cell of the conventional FeRAM includes one switching element configured to perform a switching operation depending on a state of a word line so as to connect a nonvolatile ferroelectric capacitor to a bit line, and one nonvolatile ferroelectric capacitor connected between a plate line and one end of the switching element. The switching element of the conventional FeRAM is an NMOS transistor whose switching operation is controlled by a gate control signal.

SUMMARY

Various embodiments consistent with the present invention are directed at providing a one transistor field effect transistor (1T-FET) type nonvolatile ferroelectric memory cell using a bulk-silicon substrate.

Various embodiments consistent with the present invention are directed at preserving data of a nonvolatile FeRAM device when a power source is off and performing a refresh operation in a given cycle to restore degraded cell data, thereby improving data retention characteristics. Unlike DRAMs, the nonvolatile FeRAM device is configured to have the whole data retention time including the on/off time of the power source so as not to perform a refresh operation frequently, thereby reducing power consumption and improving operation performance.

According to an embodiment consistent with the present invention, a nonvolatile ferroelectric memory device using a silicon substrate comprises an insulating layer formed in an etching region of the silicon substrate, a floating channel layer formed over the insulating layer, an impurity layer formed at both ends of the floating channel layer and including a source region formed over the insulating layer and a drain region formed over the silicon substrate, a ferroelectric layer formed over the floating channel layer, and a word line formed over the ferroelectric layer.

According to an embodiment consistent with the present invention, a nonvolatile ferroelectric memory device using a silicon substrate comprises a memory cell, a register configured to store information of the memory cell, and a refresh control unit configured to perform a refresh operation in a given refresh cycle using the information stored in the register so as to improve retention characteristics of data stored in the memory cell. The memory cell comprises a silicon substrate, a ferroelectric layer formed over the floating channel layer, and a word line formed over the ferroelectric layer. The silicon substrate includes a floating channel layer and drain/source regions formed at both ends of the floating channel layer. The memory cell is configured to induce a different channel resistance to a channel region of the floating channel layer depending on a polarity state of the ferroelectric layer so as to read/write data.

According to an embodiment consistent with the present invention, a nonvolatile ferroelectric memory device using a silicon substrate comprises a cell array including a plurality of nonvolatile memory cells each being configured to read/write data, a refresh control unit configured to control a refresh operation in a given cycle in response to a refresh control signal for improving retention characteristics of data stored in the memory cell so as to output a count address for refresh operations, a row address control unit configured to latch and decode a row address in response to a RAS signal and an output signal from the refresh control unit and to select the count address in the refresh mode, a column address control unit configured to latch and decode a column address in response to a CAS signal, and an input/output logic circuit configured to control read/write operations of the cell array in response to an output enable signal and read/write commands. The cell array comprises an insulating layer formed in an etching region of the silicon substrate, a floating channel layer formed over the insulating layer, an impurity layer formed at both ends of the floating channel layer and including a source region formed over the insulating layer and a drain region formed over the silicon substrate, a ferroelectric layer formed over the floating channel layer, and a word line formed over the ferroelectric layer.

Consistent with the present invention, there is provided a method for refreshing a nonvolatile ferroelectric memory device using a silicon substrate that comprises a 1T-FET type memory cell includes the steps of: reading/writing data in the memory cell; and refreshing data of the memory cell so as to improve retention characteristics of data stored in the memory cell. The memory cell comprises a silicon substrate, a ferroelectric layer formed over the floating channel layer, and a word line formed over the ferroelectric layer. The silicon substrate includes a floating channel layer, and drain/source regions formed at both ends of the floating channel layer. The memory cell is configured to induce a different channel resistance to a channel region of the floating channel layer depending on a polarity state of the ferroelectric layer so as to read/write data.

Further consistent with the present invention, there is provided a method for manufacturing a nonvolatile ferroelectric memory device using a silicon substrate, the method comprising the steps of: etching a silicon substrate to have a T shape with an etching mask formed over the silicon substrate to form a plurality of T-shaped silicons spaced with a given interval; filling an insulating layer in the T-shaped etching region between the plurality of T-shaped silicons and a silicon between the plurality of T-shaped silicons to grow a silicon crystal; sequentially forming a ferroelectric layer and a word line over the resulting structure, and etching the ferroelectric layer and the word line selectively; ion-implanting impurities into the plurality of T-shaped silicons and the silicon to form drain/source regions, and forming a floating channel layer separated from the drain/source regions; and forming a sensing line and a bit line over the impurities.

DETAILED DESCRIPTION

The present invention will be described in detail with reference to the accompanying drawings.

Figure 1:
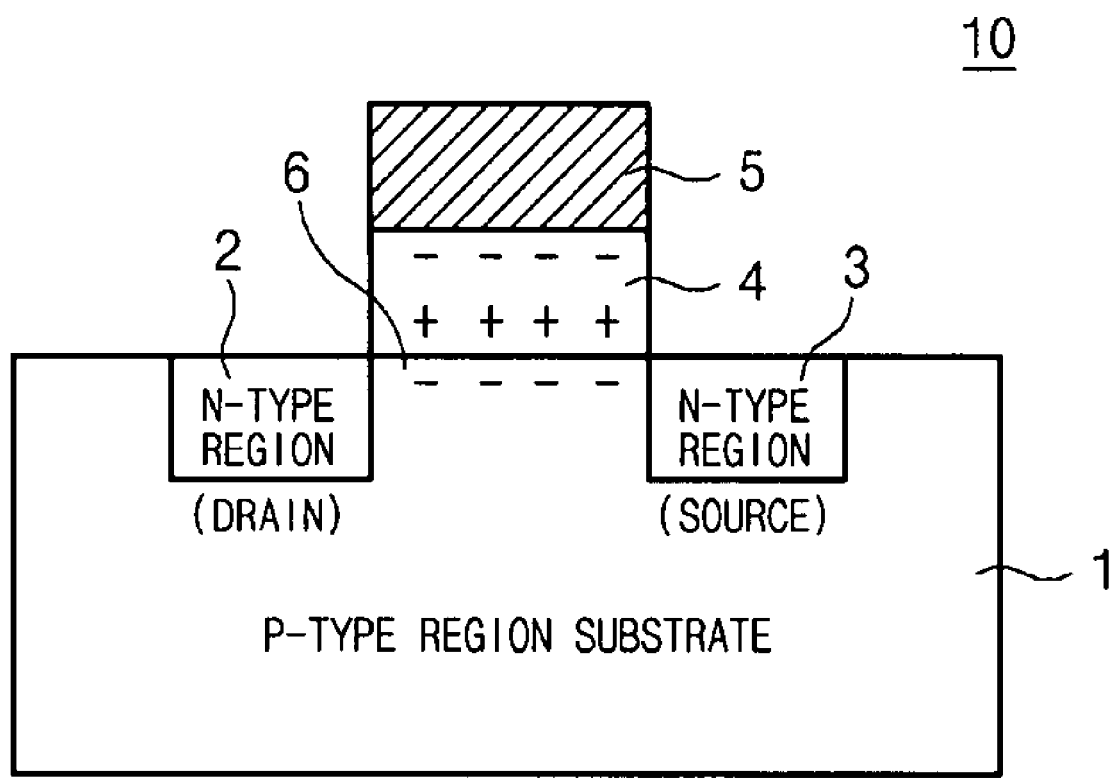
FIG. 1 is a cross-sectional diagram illustrating a cell of a conventional nonvolatile ferroelectric memory device.
Figure 2:
FIGS. 2 through 11 are cross-sectional diagrams illustrating a method for manufacturing a nonvolatile ferroelectric memory device using a silicon substrate according to an embodiment consistent with the present invention.
Figure 3:
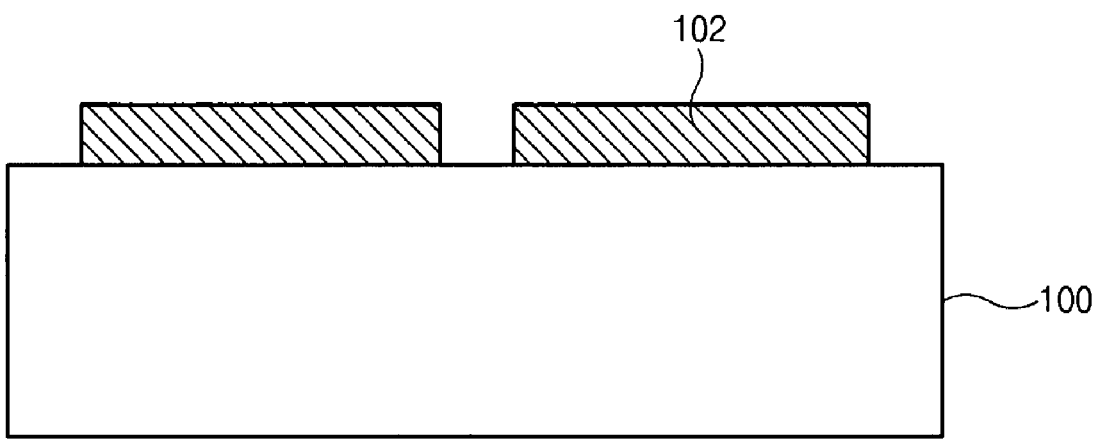
Figure 4:
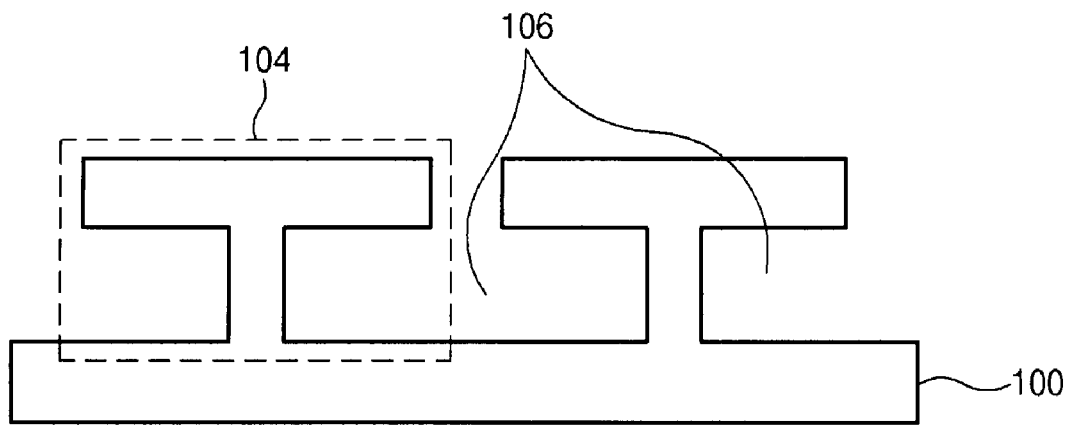
Figure 5:
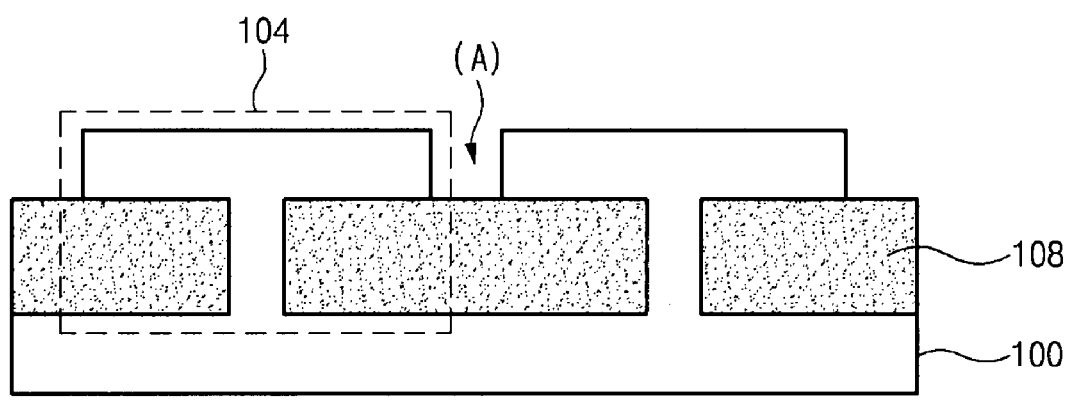
Figure 6:
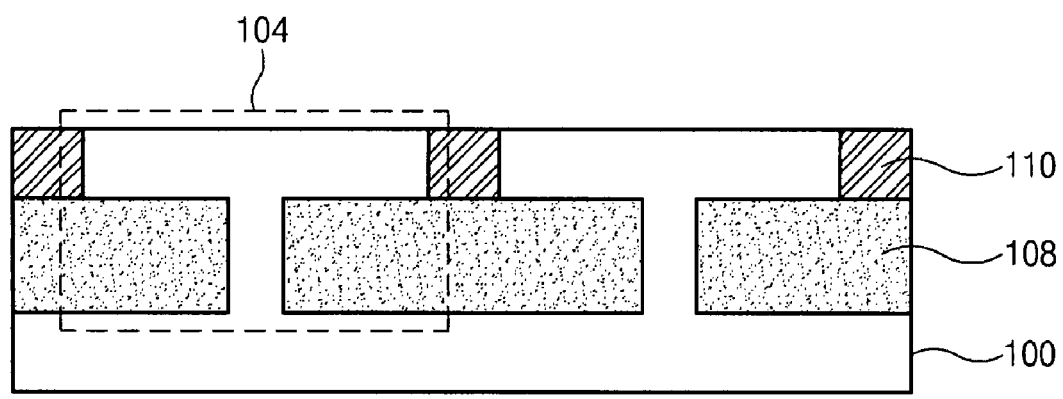
Figure 7:
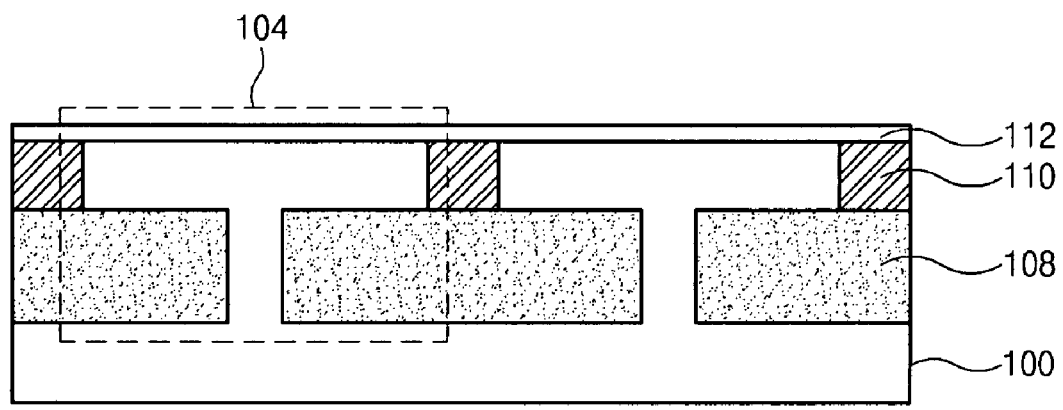
Figure 8:
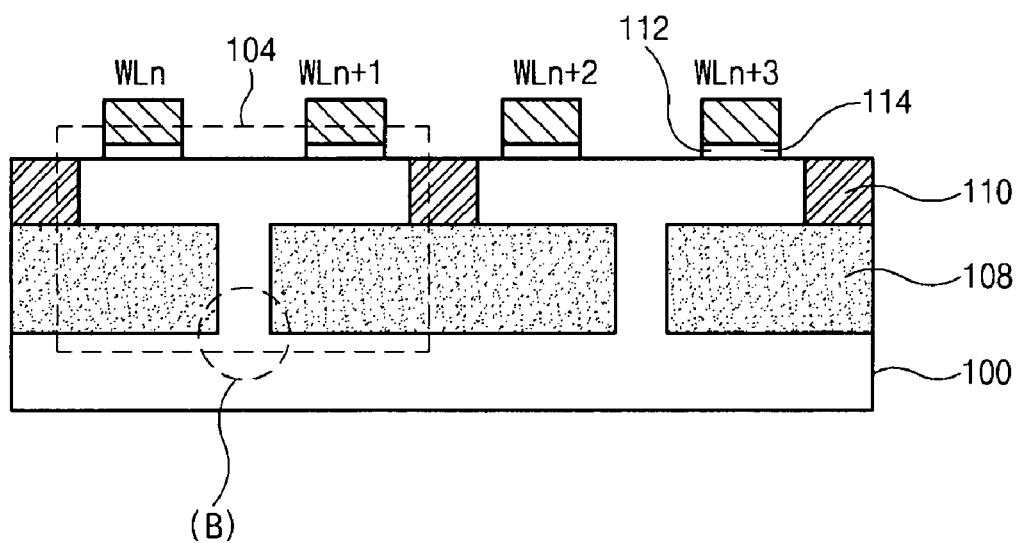
Figure 9:
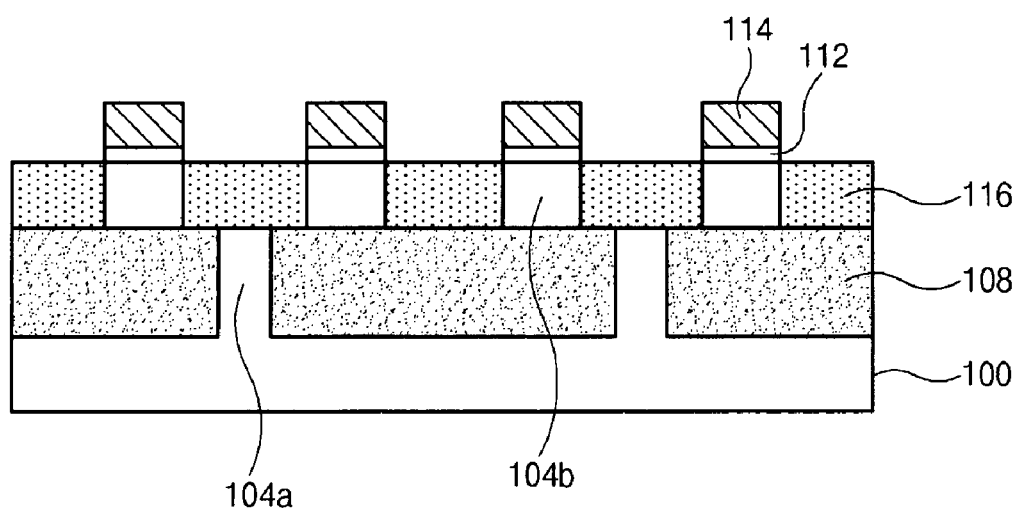
Figure 10:
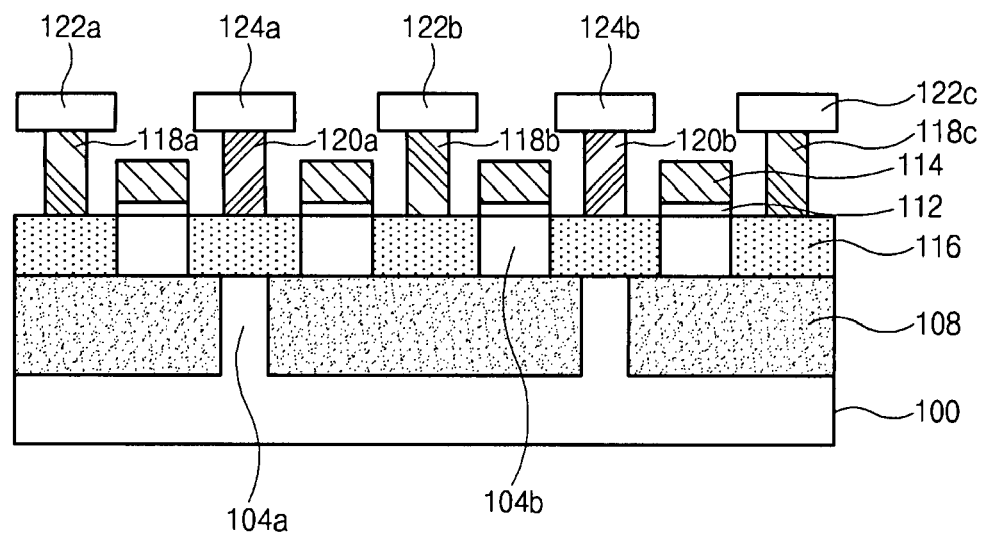

FIG. 1 is a cross-sectional diagram illustrating a cell of a conventional nonvolatile ferroelectric memory device.

A conventional One-Transistor Field Effect Transistor (1-T FET) type memory cell 10 includes a P-type channel region 6, an N-type drain region 2, and an N-type source region 3 over a P-type region substrate 1. A ferroelectric layer 4 is formed over channel region 6, and a word line 5 is formed over ferroelectric layer 4.

Data may be read/written based on a channel resistance of the memory cell 10. The channel resistance may be differentiated depending on polarization states of ferroelectric layer 4.

When the polarity of ferroelectric layer 4 induces positive charges to channel region 6, memory cell 10 becomes at a high resistance channel state, and the channel is turned off. On the other hand, when the polarity of ferroelectric layer 4 induces negative charges to channel region 6, memory cell 10 becomes at a low resistance channel state, and the channel is turned on. In this way, the conventional nonvolatile FeRAM device may select polarization kinds of ferroelectric layer 4 to write data in memory cell 10, which becomes a nonvolatile memory cell.

However, a memory cell of the conventional 1T-FET type ferroelectric memory device is formed in a Silicon On Insulator (SOI) substrate, thereby increasing the manufacturing cost of the memory cell.

Manufacturing processes of a 1T type memory cell using an SOI substrate is not interchangeable with that of a 1T1C type memory cell using a silicon substrate. That is, wafers, equipments, and processes used in the 1T type memory cell are different from those used in the 1T1C type memory cell. As a result, the 1T type memory cell using an SOI substrate requires additional set-ups for new wafers, equipments, and processes.

Although the 1T-FET type memory cell of the conventional FeRAM device has nonvolatile characteristics, cell data may be degraded as time passes, thereby limiting data retention life. As a result, data retention characteristics may be degraded, such that the best state of nonvolatile cell storage characteristics is not maintained.

FIGS. 2 through 11 are cross-sectional diagrams illustrating a method for manufacturing a nonvolatile ferroelectric memory device using a silicon substrate according to an embodiment consistent with the present invention.

A P-type substrate 100, which is a bare wafer, is formed. A T-shaped etching mask 102 is formed over P-type substrate 100. P-type substrate 100 for forming a T-shaped silicon structure may include bulk silicon.

P-type substrate 100 is etched to have a T shape using T-shaped etching mask 102 as an etching mask. As a result, a T-shaped silicon 104 is formed with a given interval over P-type substrate 100. A T-shaped etching region 106 having a reversed T shape is formed in a region between T-shaped silicons 104.

An insulating layer 108 is formed in T-shaped etching region 106 between T-shaped silicons 104 so that insulating layer 108 is not filled in a portion (A) over T-shaped silicon 104. Insulating layer 108 includes an oxide layer.

An single crystal silicon 110 having substantially the same height as that of the portion (A) over T-shaped silicon 104 is formed in portion (A) between T-shaped silicons 104. Single crystal silicon 110 is formed and crystallized in top portion (A) of T-shaped single crystal silicon 104.

In one embodiment, T-shaped single crystal silicon 104 and silicon region 110 may be grown to form a single crystal so as to be interconnected. As a result, there is no space between T-shaped silicon 104 and silicon region 110 so that a floating channel region is sufficiently formed.

Although single crystal silicon 110 may be grown in portion (A) between T-shaped silicons 104 in this embodiment, a poly crystalline silicon (not shown) may be filled in portion (A) between T-shaped silicons 104 and thermally grown to be single-crystallized like silicon 110. The poly crystalline silicon may include amorphous silicon or poly silicon.

A ferroelectric layer 112 is formed over T-shaped silicon 104 and silicon 110 region.

A word line 114 gate region is formed over ferroelectric layer 112. Ferroelectric layer 112 and word line 114 are selectively etched through an etching mask (not shown). As a result, a plurality of word lines 114 are spaced with a given interval. Word lines 114 are formed in a floating body region at both ends of T-shaped silicon 104, but not over a region (B) connected to T-shaped silicon 104 and P-type substrate 100.

An N+ layer 116, which is an impurity-implanting layer, is implanted into silicon 110 region and top region of T-shaped silicon 104 to form floating channel layers 104b, which are spaced with a given interval. A channel region of the floating channel layer 104b becomes floated, and N+ layer 116 is not implanted into floating channel layer 104b. The channel layer of floating channel layer 104b becomes floated, and N+ layer 116 formed in both ends of floating channel layer 104b is used as drain/source regions.

A bulk connection silicon 104a is formed in a region where the top side of T-shaped silicon 104 implanted with N+ layer 116 is connected to P-type substrate 100. Bulk connection silicon 104a may have substantially the same height as that of insulating layer 108. Floating channel layer 104b may be formed over a portion of insulating layer 108 where bulk connection silicon 104a is not formed.

N+ layer 116 is implanted into the top portion of bulk connection silicon 104a to electrically separate a bulk silicon from the source and drain ends. N+ layer 116 formed over bulk connection silicon 104a may be used as source and drain regions. N+ layer 116 may be implanted into a filling layer of silicon 110 to form a source/drain end so that the floating body region may have desirable silicon characteristics.

In one embodiment, sensing line contacts 118a~118c and bit line contacts 120a, 120b may be formed to have a zigzag type arrangement with word lines 114 over N+ layer 116. Sensing line contacts 118a~118c and bit line contacts 120a, 120b formed over N+ layer 116 are formed alternately between word lines 114 by a line pattern process.

Sensing line contacts 118a~118c are formed over regions of insulating layer 108 where bulk connection silicon 104a is not formed. Bit line contacts 120a, 120b connected to the bit line are formed over the region of bulk connection silicon 104a.

Sensing lines 122a~122c are formed over sensing line contacts 118a~118c, respectively. Bit line contact pads 124a, 124b are formed over bit line contacts 120a, 120b, respectively.

Bit line contacts 126 are formed over bit line contact pads 124a, 124b. Bit line 128 having a bar type extended length is formed over bit line contacts 126.

In this embodiment, T-shaped silicon 104 may be formed from silicon substrate 100, bottom word line 108 may be formed in the bottom edge region of T-shaped silicon 104, and the 1T-FET type ferroelectric memory cell having a floating channel may be formed over silicon region 112.

An N-type semiconductor may be used as the drain/source regions, and a P-type semiconductor may be used as the channel region of floating channel layer 104b. Alternatively, a P-type semiconductor may be used as the drain/source regions, and an N-type semiconductor may be used as the channel region of floating channel layer 104b. The semiconductor of floating channel layer 104b may include a carbon nano tube, silicon, or germanium(Ge).

Consistent with an embodiment of the present invention, data is read/written according to a channel resistance of floating channel layer 104b, which is differentiated depending on polarization states of ferroelectric layer 112.

Suppose that the drain and source regions of floating channel layer 104b are formed to be N-type and the channel region is formed to be P-type. When ferroelectric layer 112 induces positive charges to the channel region of floating channel layer 104b, the memory cell transitions to a high resistance state so that the channel is turned off. On the other hand, when the polarity of ferroelectric layer 112 induces negative charges to the channel region, the memory cell transitions to a low resistance state so that the channel is turned on. In this way, polarization states of ferroelectric layer 112 are selected to write data in the cell. The cell thus becomes a nonvolatile memory cell.

Figure 12:
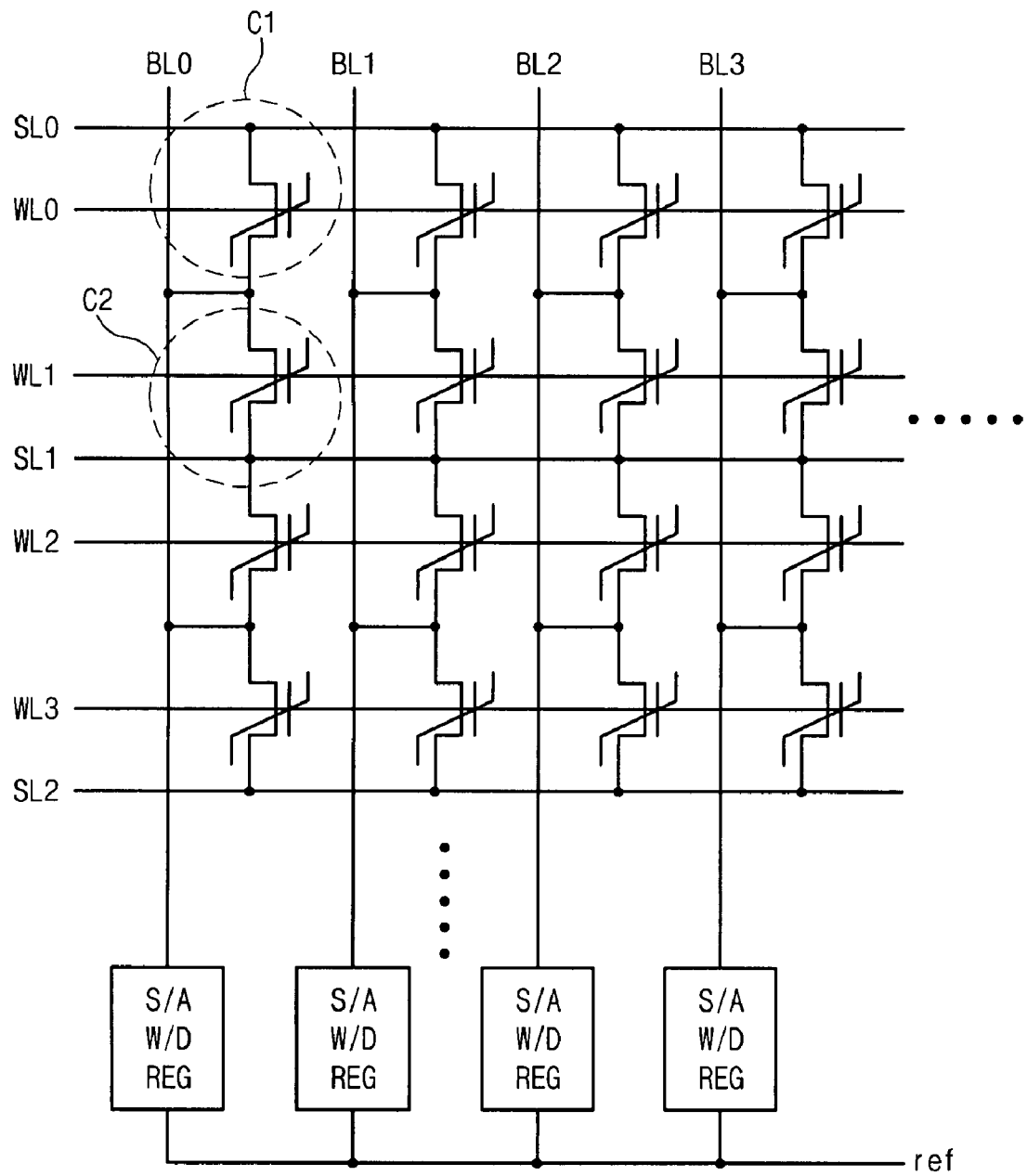
FIG. 12 is a cross-sectional diagram illustrating a cell array of a nonvolatile ferroelectric memory device using a silicon substrate according to an embodiment consistent with the present invention.

FIG. 12 is a cross-sectional diagram illustrating a cell array of a nonvolatile ferroelectric memory device using a silicon substrate according to an embodiment consistent with the present invention.

The cell array includes a plurality of word lines WL and a plurality of sensing lines SL. Word lines WL and sensing lines SL are arranged with a given interval in a row direction. A plurality of bit lines BL are arranged in a column direction so that bit lines BL are crossed with word lines WL and sensing lines SL. A plurality of unit cells C are formed where bit lines BL, word lines WL, and sensing lines SL are crossed.

Adjacent unit cells C1 and C2 have a common source connected to sensing line SL and a common drain connected to bit line BL. Gates of unit cells C1 and C2 are connected to word lines WL<0>, WL<1> and bottom word lines BWL<0>, BWL<1>.

A sense amplifier S/A senses and amplifies cell data to distinguish data "1" from data "0" so that sense amplifier S/A is connected to bit line BL. When data are written in the memory cell, a write driver W/D is configured to generate a driving voltage depending on write data so as to supply the driving voltage to bit line BL. Write driver W/D is connected to bit line BL.

Register REG, which may serve as a temporary memory element for storing data of the sense amplifier S/A temporarily, is connected to bit line BL. A reference voltage ref is supplied to sense amplifier S/A, write driver W/D, and register REG.

Figure 13:
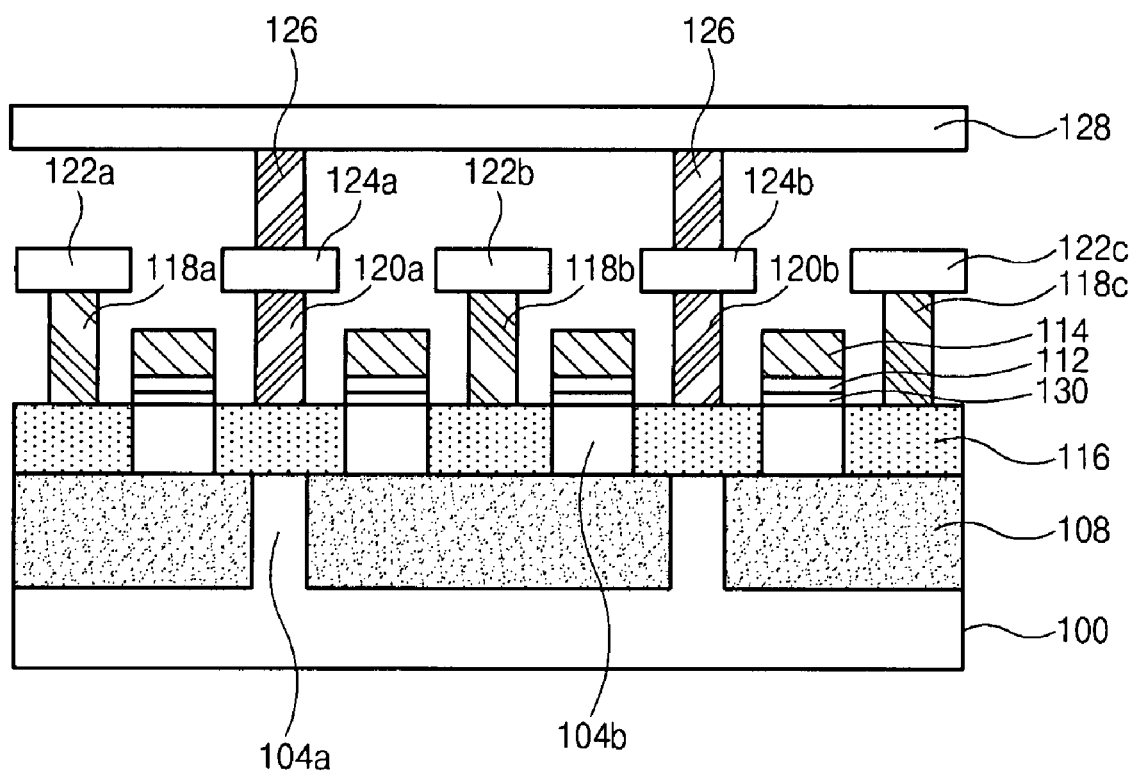
FIG. 13 is a cross-sectional diagram illustrating a nonvolatile ferroelectric memory device using a silicon substrate according to an embodiment consistent with the present invention.

FIG. 13 is a diagram illustrating a nonvolatile ferroelectric memory device using a silicon substrate according to an embodiment consistent with the present invention.

Figure 11:
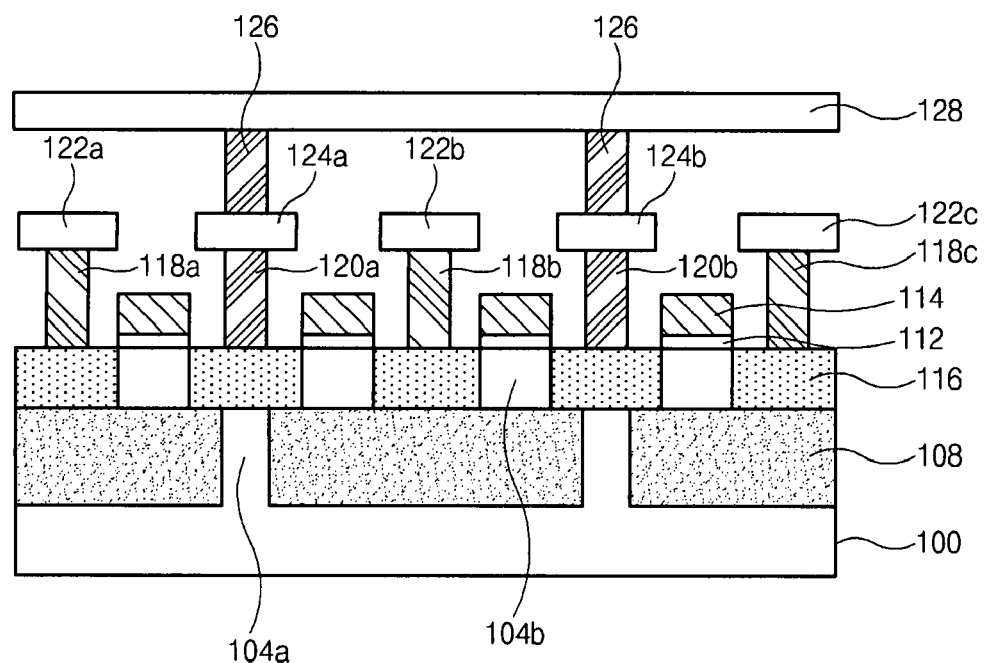

The nonvolatile ferroelectric memory device of FIG. 13 is different from that of FIG. 11 in that a buffer insulating layer 130 is formed between ferroelectric layer 112 and floating channel layer 104b. Buffer insulating layer 130 is formed to overcome difference in processes and materials of floating channel layer 104b and ferroelectric layer 112.

Figure 14:
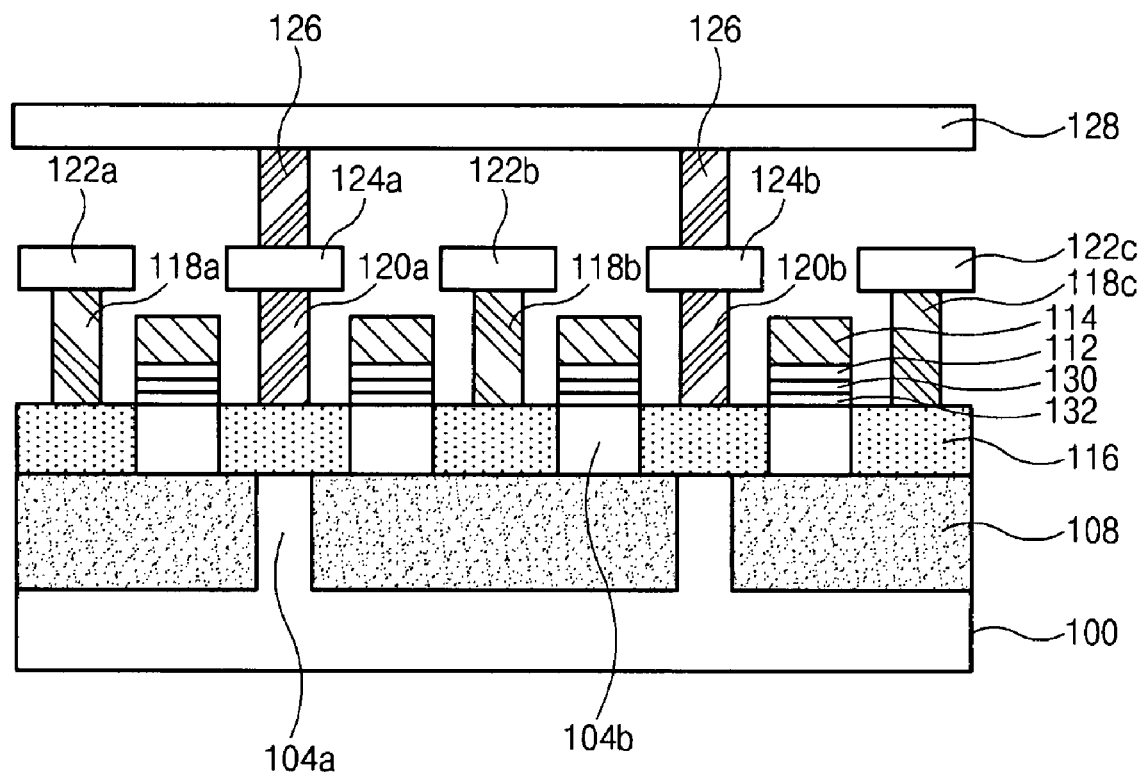
FIG. 14 is a cross-sectional diagram illustrating a nonvolatile ferroelectric memory device using a silicon substrate according to an embodiment consistent with the present invention.

FIG. 14 is a cross-sectional diagram illustrating a nonvolatile ferroelectric memory device using a silicon substrate according to an embodiment consistent with the present invention.

The nonvolatile ferroelectric memory device of FIG. 14 is different from that of FIG. 13 in that a floating conductive layer 132 is formed between buffer insulating layer 130 and floating channel layer 104b. Floating conductive layer 132 is formed to protect polarization charges so as to improve data retention characteristics. An insulating layer is formed between floating conductive layer 132 and floating channel layer 104b, and a buffer layer is formed for electric insulation. Data of all cells of the selected row address are read, amplified and stored in a register. Since data "1" is written in all memory cells, it is not known which data are stored in the existing memory cell. As a result, data are stored in order to know which data are stored in the existing memory cell before the data "1" is written in the memory cell.

The data "1" is written in all cells of the selected row address. The data stored in the register are rewritten and restored in the memory cell so that new external data are written in new cells. As a result, the data "1" is preserved because the data "1" is previously written, and new data is written to data "0" stored in the memory cell.

Figure 15:
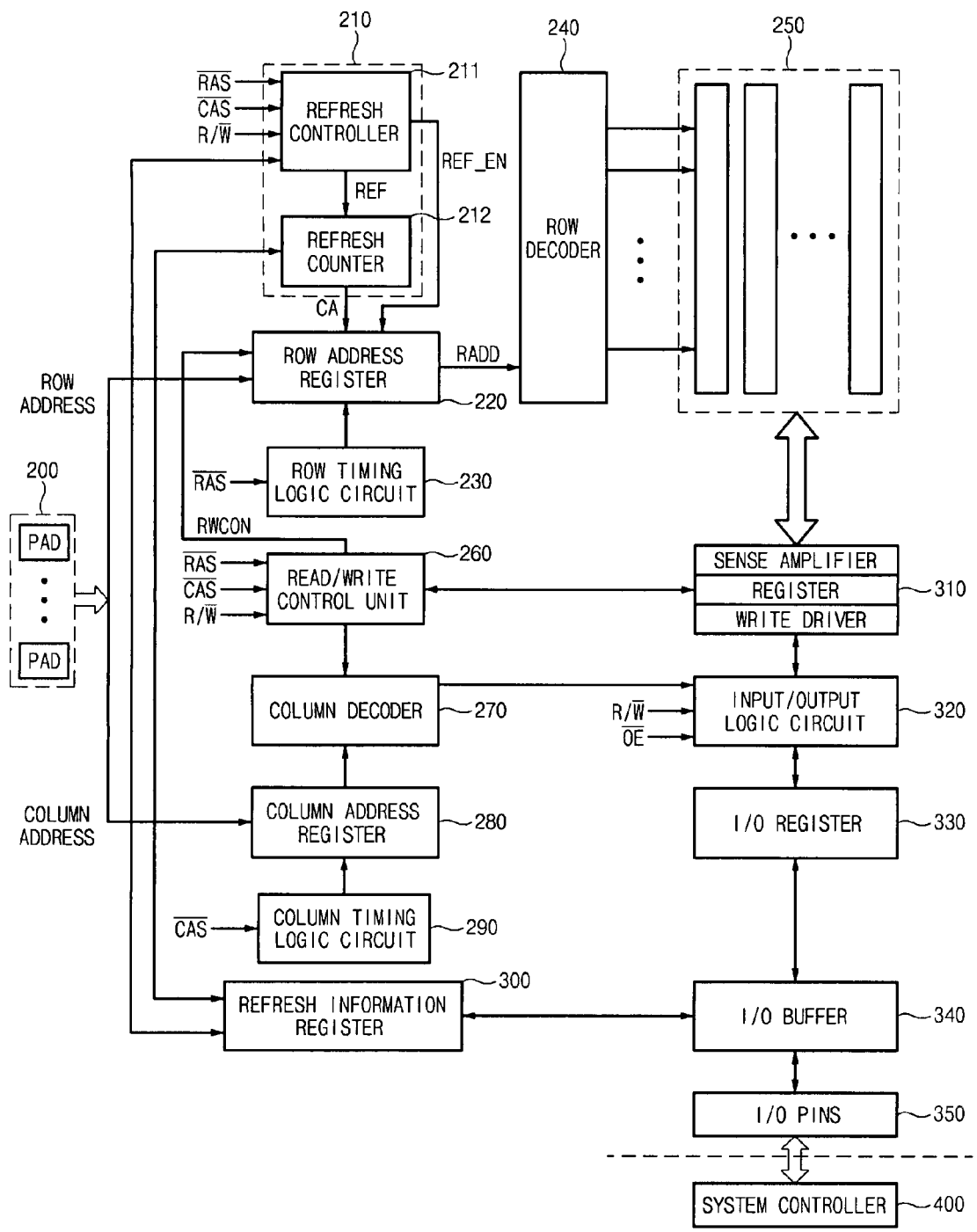
FIG. 15 is a diagram illustrating a nonvolatile ferroelectric memory device using a silicon substrate according to an embodiment consistent with the present invention.

FIG. 15 is a diagram illustrating a nonvolatile ferroelectric memory device using a silicon substrate according to an embodiment consistent with the present invention.

The nonvolatile ferroelectric memory device includes a pad array 200, a refresh control unit 210, a row address register 220, a row timing logic circuit 230, a row decoder 240, a cell array 250, a read/write control unit 260, a column decoder 270, a column address register 280, a column timing logic circuit 290, a refresh information register 300, a sense amplifier, register and write driver 310, an input/output logic circuit 320, an I/O register 330, an I/O buffer 340, and I/O pins 350.

Refresh control unit 210 includes a refresh controller 211 and a refresh counter 212. Cell array 250 includes a plurality of 1T-FET type unit cells of FIGS. 2 through 11.

Pad array 200 includes a plurality of pads PAD, each of which may be configured to receive a row address and a column address so as to output the addresses with a time variance. Refresh controller 111 outputs a refresh signal REF and a refresh enable signal REF_EN for controlling refresh operations in response to a RAS signal /RAS, a CAS signal /CAS, read/write commands R/W, and a refresh control signal. Refresh counter 212 counts a refresh cycle in response to refresh signal REF applied from refresh controller 211 and refresh control signal received from refresh information register 300 to output count address CA. Refresh controller 211 and refresh counter 212 outputs refresh operation information and refresh count information to refresh information register 300.

Row address register 220 receives the row address received from pad array unit 200 and stores the address temporarily. Row address register 220 outputs row address RADD activated in response to an output signal from row timing logic circuit 230 and a read/write control signal RWCON received from read/write control unit 260 into row decoder 240. Row timing logic circuit 230 controls the storage operation and the address output timing of row address register 220 in response to an RAS signal /RAS. Row decoder 240 decodes the row address applied from row address register 220 to output the address to cell array 250.

Read/write control unit 260 outputs read/write control signal RWCON for controlling read/write operations into row address register 220 in response to RAS signal /RAS, CAS signal /CAS and read/write command R/W, so as to control column decoder 270 and sense amplifier, register and write driver 310.

Column decoder 270 decodes the column address applied from column address register 280 depending on control of read/write control unit 260 to output the address to input/output logic circuit 320. Column address register 280 may temporarily store the column address received from pad array 200 so as to output the address into column decoder 270 depending on control of column timing logic circuit 290.

Column timing logic circuit 290 controls the storage operation and address output timing of column address register 280 in response to CAS signal /CAS. Register 310 may output refresh data to the memory cell depending on the control of column timing logic circuit 290 when the signal REF is activated.

Refresh information register 300 is a nonvolatile register configured to store parameters related to refresh operations. Refresh information register 300 stores refresh count information, power-off timing information of the system or internal memories, and other parameter information so as to output a refresh control signal based on the parameter information in the refresh operations. In the power-off timing, information of refresh controller 211 and refresh counter 212 is transmitted into refresh information register 300, and information related to external commands received from I/O buffer 340 is stored. The information stored in refresh information register 300 through I/O buffer 340 and I/O pins 350 is output into a system controller 400.

Sense amplifier S/A senses and amplifies cell data to distinguish data "1" from data "0". Write driver W/D generates a driving voltage in response to write data when data is written in the memory cell to supply the driving voltage to bit line BL. Register REG may temporarily store data sensed in sense amplifier S/A, and re-store data in the memory cell in the write operation.

Input/output logic circuit 320 reads data stored in cell array 250 depending on an output signal from column decoder 270 and read/write commands R and /W, and stores data in the cell array 250. Input/output logic circuit 320 includes a column selecting signal C/S, and outputs data stored in cell array 250 to data I/O register 330 in response to an output enable signal/ OE.

I/O buffer 340 buffers read data stored in I/O register 330 to output buffered data into I/O pins 350. I/O buffer 340 buffers write data received through I/O pins 350 to output the buffered data into I/O register 330. I/O buffer 340 outputs information stored in refresh information register 300 into system controller 400 through I/O pins 350. I/O pins 350 outputs data received from I/O buffer 340 into system controller 400 through data buses, or output data from system controller 400 through data buses into I/O buffer 340.

Figure 16:
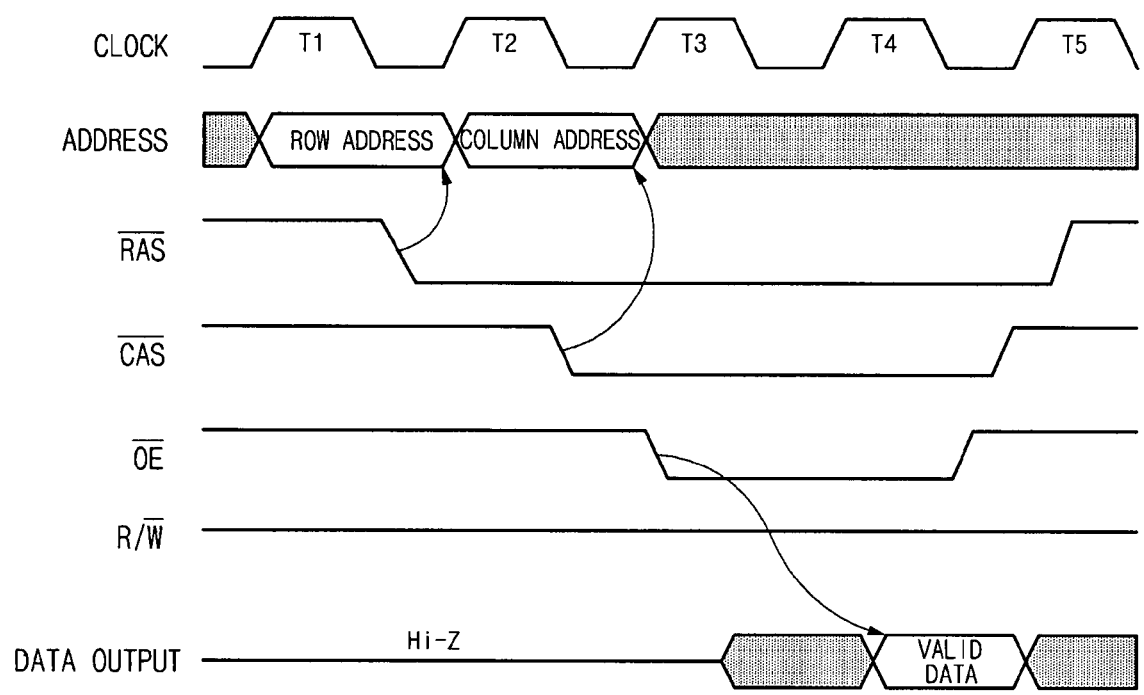
FIG. 16 is a timing diagram illustrating a read operation of a nonvolatile ferroelectric memory device using a silicon substrate according to an embodiment consistent with the present invention.
Figure 17:
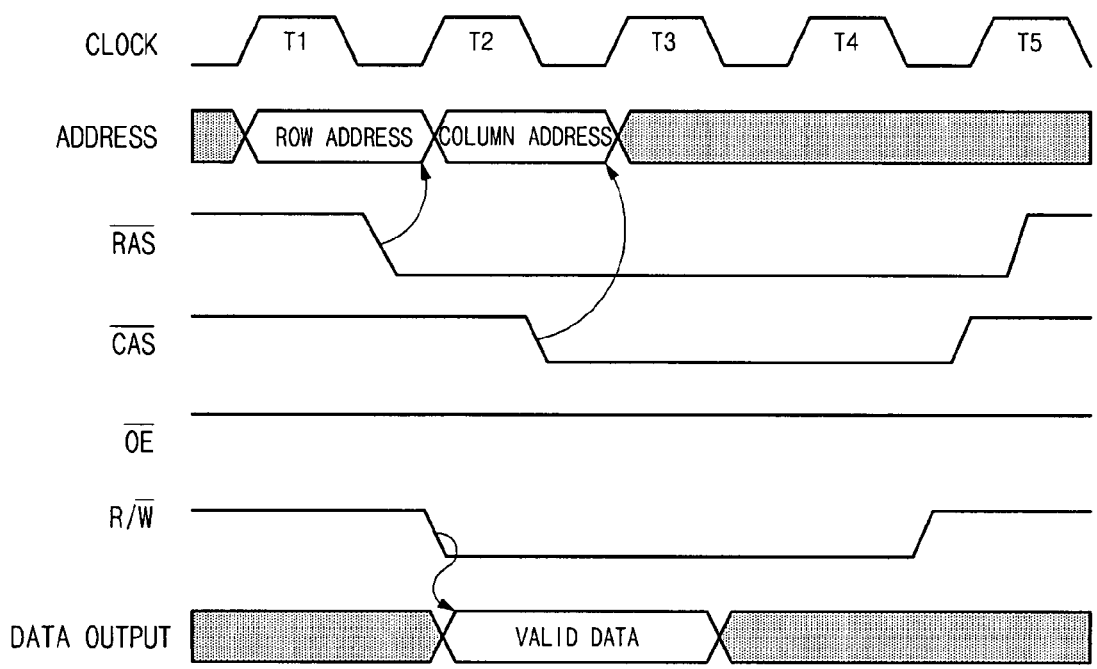
FIG. 17 is a timing diagram illustrating a write operation of a nonvolatile ferroelectric memory device using a silicon substrate according to an embodiment consistent with the present invention.

FIG. 16 is a timing diagram illustrating a read operation of a nonvolatile ferroelectric memory device using a silicon substrate according to an embodiment consistent with the present invention. FIG. 17 is a timing diagram illustrating a write operation of a nonvolatile ferroelectric memory device using a silicon substrate according to an embodiment consistent with the present invention.

Pad array 200 receives a row address and a column address through a plurality of pads PAD, and outputs the addresses to row address register 220 and column address register 280. Row address register 220 and column address register 280 output the row address and the column address with a given time difference depending on control of row timing logic circuit 230 and column timing logic circuit 290 by timing multiplexing.

Row address register 220 stores the row address temporarily in synchronization with RAS signal /RAS, and outputs row address RADD to row decoder 240. When row address RADD is output, column address register 280 temporarily stores the column address.

Row address register 220 selects the row address received from pad array 200 in a normal mode to output the address into row decoder 240. When a refresh enable signal REF_EN is activated in a refresh mode, row address register 220 selects count address CA received from refresh counter 212 to output the address into row decoder 240.

Column address register 280 stores the column address temporarily in synchronization with CAS signal /CAS, and outputs the column address to column decoder 270. When the column address is output, row address register 220 stores the row address temporarily.

In the read mode, when output enable signal /OE is activated while read command R is activated, data stored in cell array 250 is output to the data buses depending on input/output logic circuit 320. On the other hand, in the write mode, when output enable signal /OE is inactivated while write command /W is activated, data is stored in cell array 250 depending on input/output logic circuit 320.

Figure 18:
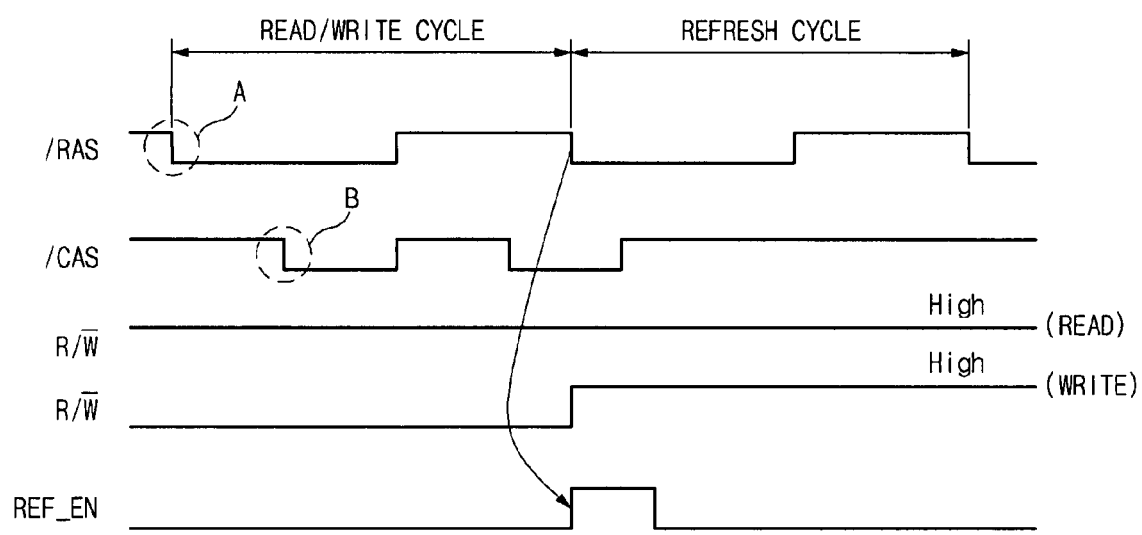
FIG. 18 is timing diagram illustrating a method for refreshing a nonvolatile ferroelectric memory device using a silicon substrate according to an embodiment consistent with the present invention.

FIG. 18 is timing diagram illustrating a refresh method of a nonvolatile ferroelectric memory device according to an embodiment consistent with the present invention.

Refresh controller 211 outputs refresh signal REF for performing a refresh operation into refresh counter 212, and outputs refresh enable signal REF_EN into row address register 220 in response to RAS signal /RAS, CAS signal /CAS, read/write commands R,/W, and refresh control signal when a refresh operation command is applied. Refresh counter 212 counts a refresh cycle in response to refresh signal REF applied from refresh controller 211 and refresh control signal to output count address CA to row address register 220.

Count address CA output from refresh counter 212 is stored in row address register 220. Column timing logic circuit 290 outputs data stored in column address register 280 into column decoder 270 in response to CAS signal /CAS. When sense amplifier S/A is activated, refresh data stored in register REG through input/output logic circuit 320 is written in cell array 250.

Refresh signal REF may be a control signal using RAS signal /RAS and CAS signal /CAS. That is, when refresh signal REF is a control signal using RAS signal /RAS and CAS signal /CAS, the refresh operation is performed with a /CAS before /RAS system (/CBR).

In the normal mode for performing read and write operations, RAS signal /RAS is activated faster than CAS signal /CAS so that a normal operation is performed depending on row timing logic circuit 230 and column timing logic circuit 290. As shown in (A), when RAS signal /RAS is activated earlier, an external row address is activated so that sense amplifier S/A is activated. As shown in (B), when CAS signal /CAS is activated, an external column address is activated.

In the refresh mode, refresh controller 211 senses CAS signal /CAS transited earlier than RAS signal /RAS to activate refresh signal REF/. That is, when refresh controller 211 senses CAS signal /CAS transited earlier than RAS signal /RAS, refresh controller 211 decides the refresh mode to activate refresh enable signal REF_EN.

Row address register 220 performs a refresh operation in response to count address CA generated depending on refresh counter 212 while a path of the normal mode is disconnected when refresh enable signal REF_EN is activated. Row address register 220 may sense simultaneous transition of CAS signal /CAS and RAS signal /RAS to activate refresh signal REF.

Although the refresh method using /CBR system is exemplified in one embodiment consistent with the present invention, the refresh operation may be performed by various methods with self-refresh, auto-refresh, or clock.

In the refresh mode, a word line WL of cell array 250, which is an output signal of refresh counter 212, is selected depending on count address CA. As a result, data of the corresponding cell having a 1T structure in cell array 250 is sensed and amplified, and stored in sense amplifier register REG. New data is written in cell array 250, or the data stored in register REG is re-stored in cell array 250.

Figure 19:
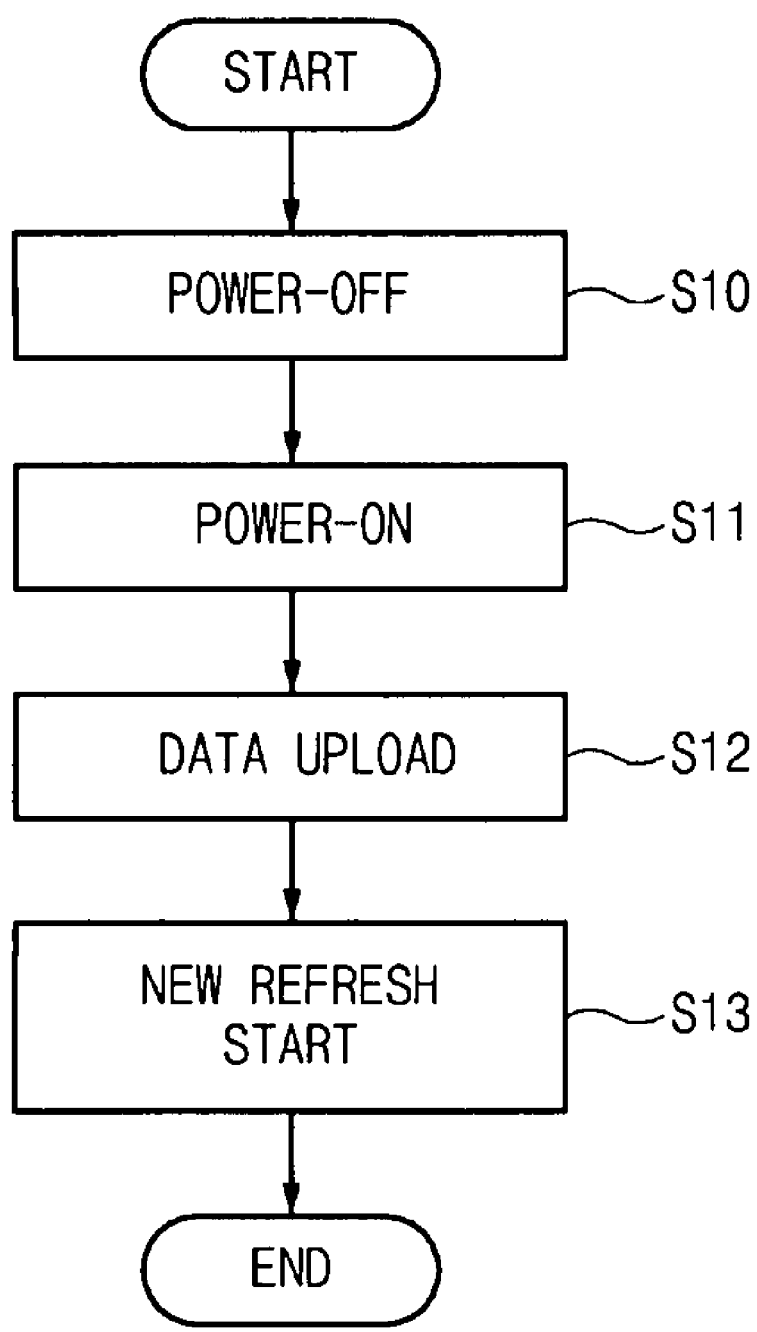
FIGS. 19 and 20 are flow charts illustrating a method for refreshing a nonvolatile ferroelectric memory device using a silicon substrate according to an embodiment consistent with the present invention.
Figure 20:
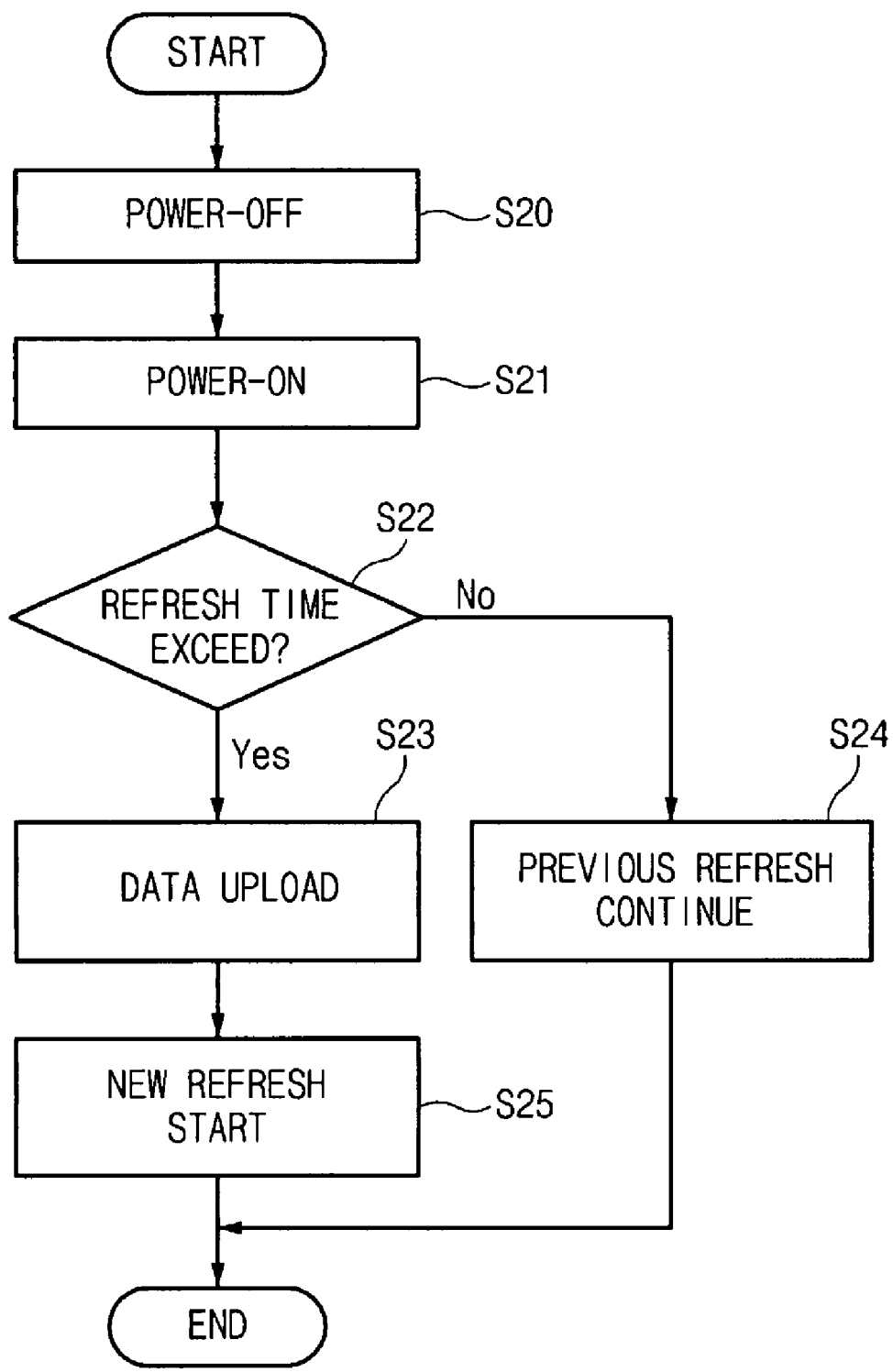

FIGS. 19 and 20 are flow charts illustrating a method for refreshing a nonvolatile ferroelectric memory device according to an embodiment consistent with the present invention.

When the power is turned on (S11) while a system power of the DRAM, which is a volatile memory, is turned off (S10), data from the memory is uploaded (S12) so that a new refresh operation starts (S13). That is, when the system power is turned on, data from the memory is required to be uploaded.

However, in the nonvolatile ferroelectric memory device according to an embodiment consistent with the present invention, when the power is turned on (S21) while the system power is turned off (S20), refresh information register 300 decides whether the refresh time is exceeded (S22).

When the refresh time is exceeded, data from the memory is uploaded (S23) so that a new refresh operation starts (S25). On the other hand, when the refresh time is not exceeded, the refresh time is effective so that the previous refresh operation continues (S24).

Refresh information register 300 stores a parameter related to the refresh operation in a nonvolatile register. Refresh information register 300 stores refresh count information, power-off timing information of the system or internal memories, and other parameter information to be nonvolatile. In refresh information register 300, an additional power sensing unit (not shown) senses on/off states of the system or the internal memory.

When the power is off, data stored in refresh information register 300 is read to calculate the refresh passing time. The refresh passing time may be stored in a mode register set MRS and controlled at a system level.

The refresh passing time calculated in response to the refresh control signal is transmitted into refresh controller 211 in response to the refresh control signal. As a result, in one embodiment, it is unnecessary to upload the refresh related information even when the power is on.

Figure 21:
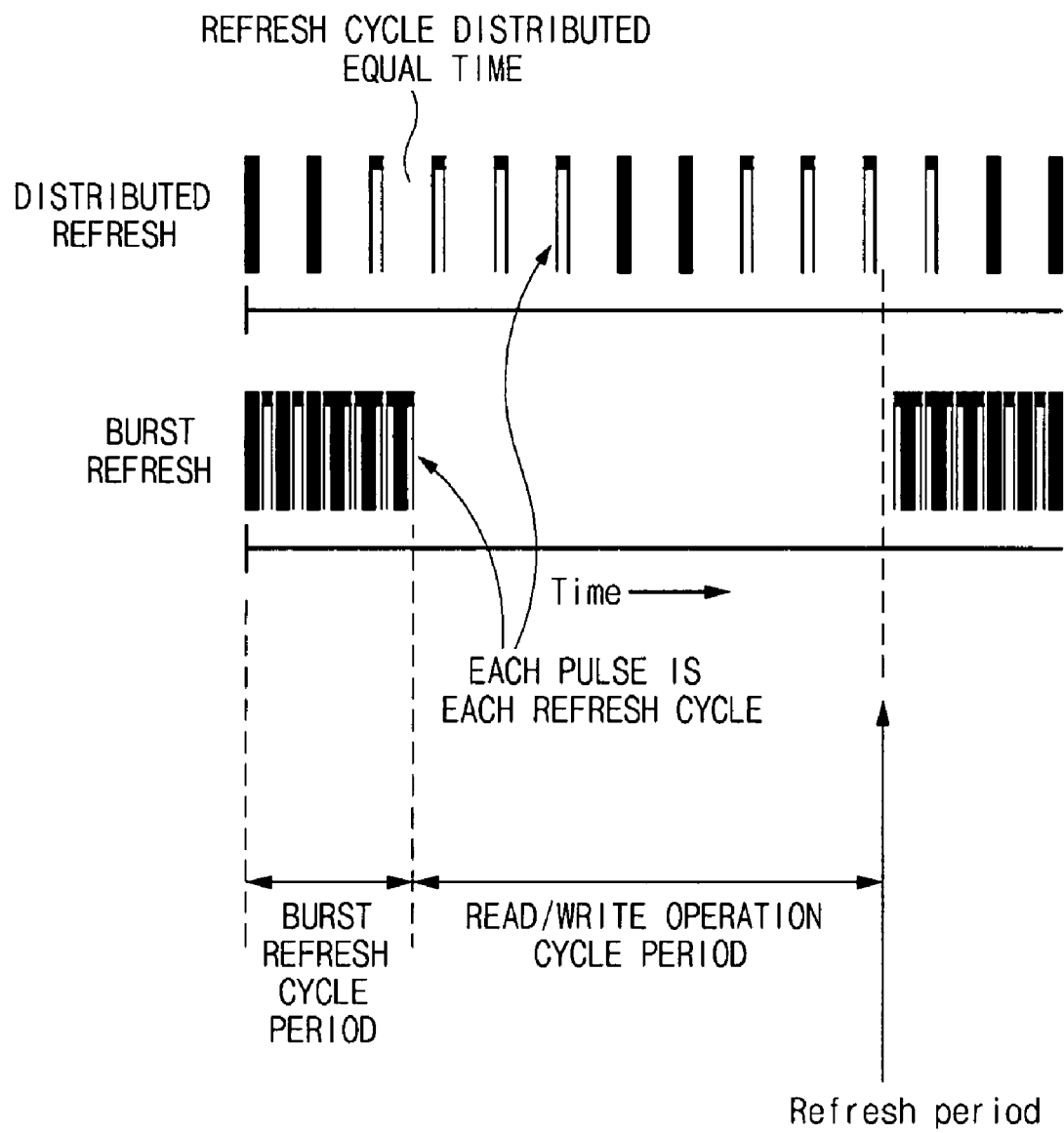
FIG. 21 is a diagram illustrating a method for refreshing a nonvolatile ferroelectric memory device using a silicon substrate according to an embodiment consistent with the present invention.

FIG. 21 is a diagram illustrating a refresh method of a nonvolatile ferroelectric memory device according to an embodiment consistent with the present invention. The refresh method includes a distributed refresh method and a burst refresh method.

In the distributed refresh method, the refresh operation is performed with the same time distribution so that all cells may be refreshed within the refresh time in response to count address CA counted in refresh counter 212. That is, when 8k rows are refreshed, each distributed refresh operation cycle is represented by (refresh time)/8k, i.e. the refresh time divided by 8k. As a result, the cell becomes initialized only when data is written in all word lines WL.

In the burst refresh method, 8k refresh cycles are continuously performed within a burst refresh cycle time. One pulse means one refresh cycle, and a normal operation is performed in read/write operation cycle periods where the pulse is inactivated.

Figure 22:
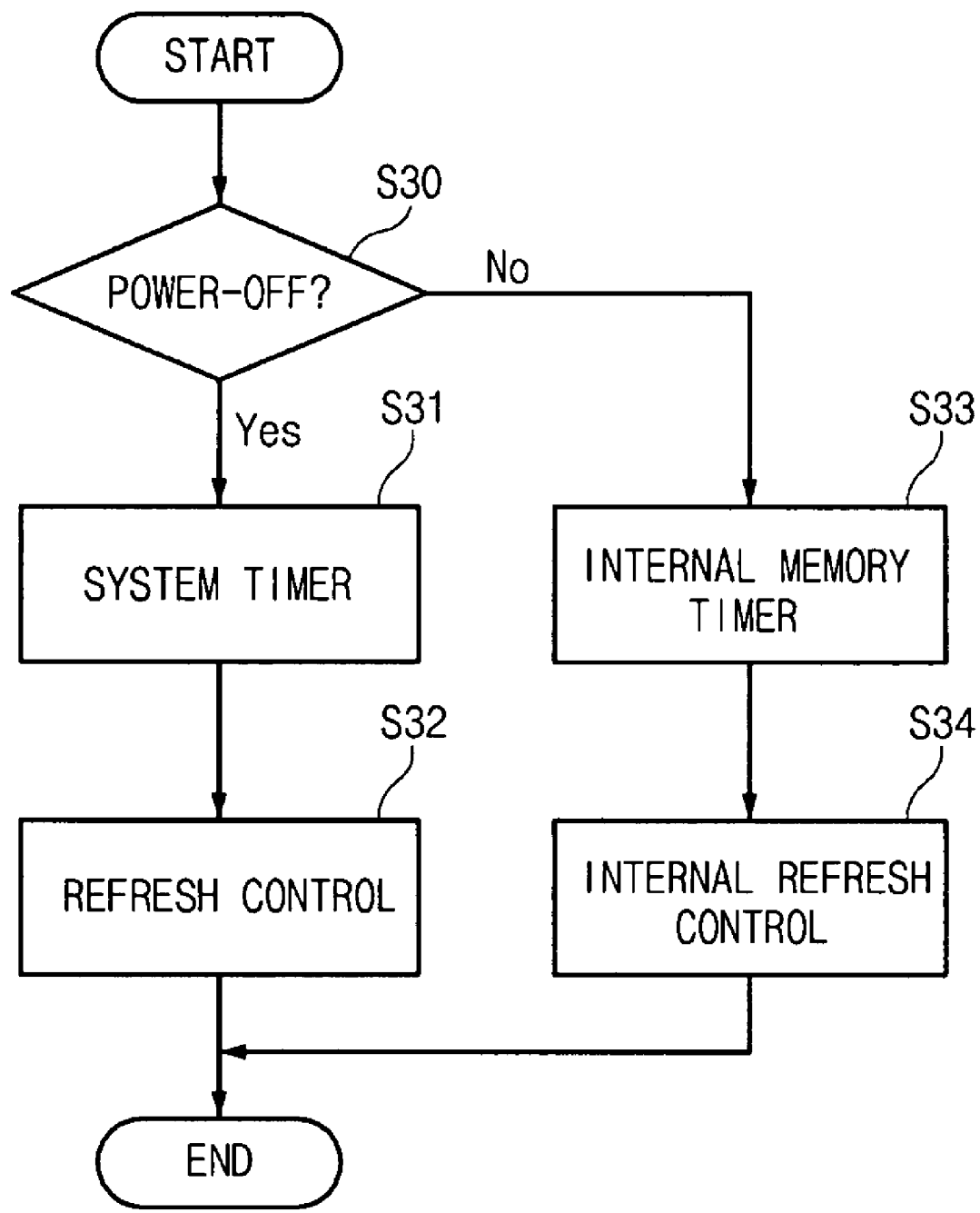
FIG. 22 is a diagram illustrating a timer control operation in the refresh method of a nonvolatile ferroelectric memory device using a silicon substrate according to an embodiment consistent with the present invention.

FIG. 22 is a diagram illustrating a timer control operation in the refresh method of a nonvolatile ferroelectric memory device according to an embodiment consistent with the present invention.

Refresh information register 300 identifies whether the system power is off, and store the result (S30) When the power is off, a system timer in the system is used (S31) while an internal memory timer is off so that the refresh operation is controlled (S32). The system timer stores a date and a time with a battery while the power source is required to be on continuously.

On the other hand, when the power is not off, the internal memory timer operated individually is used (S33) so that the internal refresh operation is controlled (S34).

One of the external system timer or the internal memory timer is selected depending on on/off states of the power through input/output data pins 350. That is, the refresh information register of the memory device including the memory timer exchanges data with the data buses through I/O buffer 340 and I/O pins 350. The system CPU including the system timers exchanges data with the memory device through the data buses.

When the power is off through data exchange between the memory device and system controller 400, the refresh operation is performed with the external system timer whose power is continuously on. When the power is on, the refresh operation is performed with the internal memory timer.

As a result, the refresh period and the memory data are effectively maintained regardless of on/off state of the power of the memory chip. Between the refresh periods, the memory chip power is turned off to reduce power consumption, and a chip power is supplied only in the refresh period.

Figure 23:
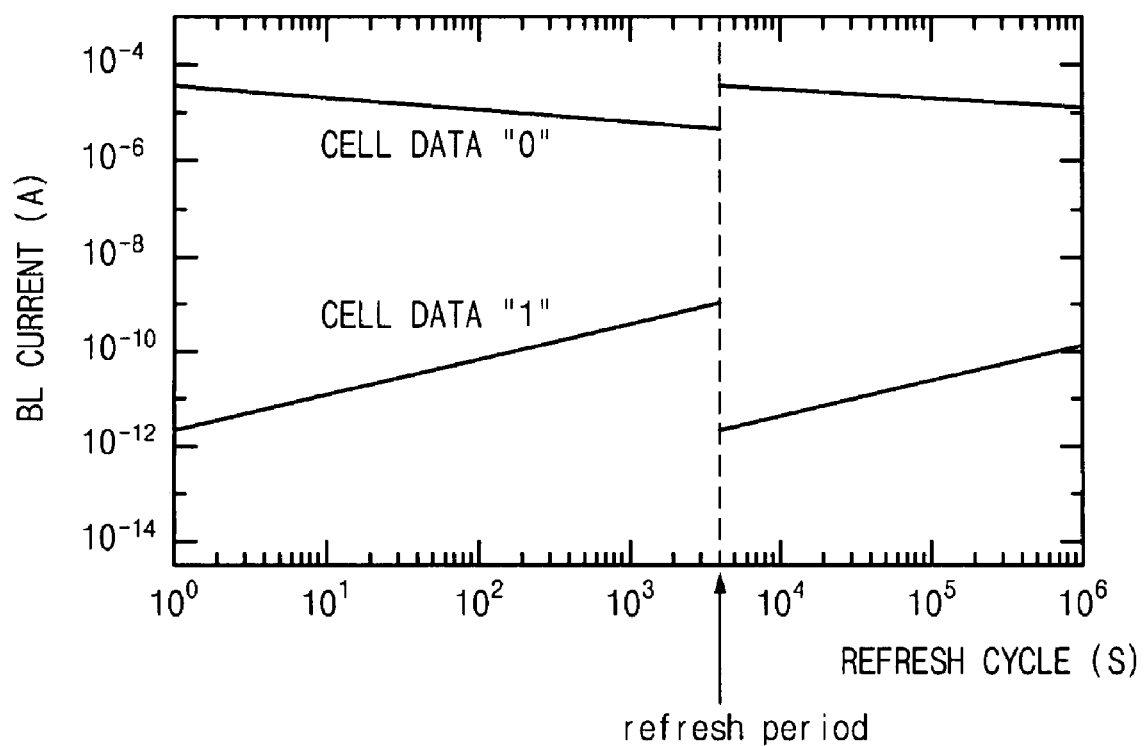
FIG. 23 is a graph illustrating data retaining characteristics of a nonvolatile ferroelectric memory device according to an embodiment consistent with the present invention.

FIG. 23 is a graph illustrating data retention characteristics of a nonvolatile ferroelectric memory device according to an embodiment consistent with the present invention.

Although the 1T-FET type memory cell of the conventional FeRAM device has nonvolatile characteristics, cell data may be degraded as time passes, thereby limiting data retention life. As a result, the bit line BL current corresponding to cell data "1" and "0" may be reduced as time passes.

However, the refresh operation is performed with a given cycle at a given timing when bit line BL current is reduced, thereby restoring cell data to improve data retention characteristics.

When the data retention characteristics of the memory cell are reduced to over a pre-set target value, a refresh circuit is driven to restore the cell data at the initial state. The degradation limit target time of the cell becomes a refresh time so that all cells are operated within the refresh time.

In contrast to the DRAM, the nonvolatile characteristics of the above-described FeRAM allows data retention even after the power source is turned off. The on/off time of the power source is added and set as the whole data retention time so that the refresh operation is not frequently performed, thereby reducing power consumption and improving operation performance.

As described above, a nonvolatile ferroelectric memory device according to an embodiment consistent with the present invention includes a 1T-FET type ferroelectric memory cell having nonvolatile characteristics using an inexpensive bulk silicon substrate so as to reduce the manufacturing cost of the memory cell. The 1T-FET type memory cell may use the same type of wafers, equipments, and processes as used for a 1T1C type memory cell. In the memory device, a refresh operation is performed with a given cycle while data are preserved when a power source is off, so as to restore degraded cell data and improve data retention characteristics. Also, the nonvolatile ferroelectric memory device has the entire data retention time including the on/off time of the power source so that the refresh operation is not frequently performed, thereby reducing power consumption and improving operation performance.

The foregoing description of various embodiments consistent with the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a nonvolatile ferroelectric memory device comprising the step of:
    etching a silicon substrate to have a T shape using an etching mask formed over the silicon substrate to form a plurality of T-shaped silicons spaced with a given interval;
    forming an insulating layer in a T-shaped etching region formed between the plurality of T-shaped silicons and filling a silicon between the plurality of T-shaped silicons to grow a silicon crystal;
    sequentially forming a ferroelectric layer and a word line over the resulting structure, and etching the ferroelectric layer and the word line selectively;
    ion-implanting impurities into the plurality of T-shaped silicons and the silicon to form drain/source regions, and forming a floating channel layer separated from the drain/source regions; and
    forming a sensing line and a bit line over the impurities.

2. The method according to claim 1, wherein the silicon substrate comprises a P-type substrate.

3. The method according to claim 1, wherein the insulating layer is not formed in a given region over the T-shaped silicon region.

4. The method according to claim 1, wherein the silicon formed between the T-shaped silicon regions comprises a single crystal.

5. The method according to claim 1, wherein the silicon filled between the T-shaped silicon region comprises a poly crystal.

6. The method according to claim 1, wherein the ferroelectric layer and the word line are spaced with a given interval in both ends of the T-shaped silicon region and formed over the insulating layer.

7. The method according to claim 1, wherein the impurity an N+ layer.

8. The method according to claim 1, wherein the drain region is connected to a bulk connection silicon region connected to the silicon substrate.

9. The method according to claim 8, wherein the bulk connection silicon region is formed to have substantially the same height as that of the insulating layer.

10. The method according to claim 1, further comprising forming a sensing line contact and a bit line contact alternately over the impurity.

11. The method according to claim 1, wherein the bit line is formed over the drain region and at atop side of the silicon substrate where the insulating layer is not formed.

12. The method according to claim 1, wherein the sensing line is formed over the source region and at a top side of the insulating layer where the silicon substrate is not formed.

13. The method according to claim 1, further comprising forming a buffer insulating layer between the floating channel layer and the ferroelectric layer.

14. The method according to claim 13, further comprising forming a floating conductive layer between the buffer insulating layer and the floating channel layer.

15. The method according to claim 1, wherein the floating channel layer is spaced with a given interval in the bottom of the ferroelectric layer, both ends of the floating channel layer being implanted with impurities to form drain/source regions.

* * * * *